(12) United States Patent
Yudanov

(10) Patent No.: US 11,887,693 B2
(45) Date of Patent: Jan. 30, 2024

(54) RECONFIGURABLE PROCESSING-IN-MEMORY LOGIC

(71) Applicant: Lodestar Licensing Group LLC, Evanson, IL (US)

(72) Inventor: Dmitri Yudanov, Rancho Cordova, CA (US)

( * ) Notice: Subject to any disclaimer, the term of this patent is extended or adjusted under 35 U.S.C. 154(b) by 0 days.

(21) Appl. No.: 17/752,430

(22) Filed: May 24, 2022

(65) Prior Publication Data
US 2022/0284936 A1 Sep. 8, 2022

Related U.S. Application Data
(63) Continuation of application No. 17/123,829, filed on Dec. 16, 2020, now Pat. No. 11,355,170.

(51) Int. Cl.
| | | |
|---|---|---|
| G11C 7/00 | (2006.01) | |
| G11C 8/06 | (2006.01) | |
| H03K 19/017 | (2006.01) | |
| G11C 8/08 | (2006.01) | |
| G11C 5/06 | (2006.01) | |
| G11C 11/408 | (2006.01) | |
| G11C 11/4094 | (2006.01) | |
| G11C 11/4096 | (2006.01) | |

(52) U.S. Cl.
CPC ............... *G11C 8/06* (2013.01); *G11C 5/06* (2013.01); *G11C 8/08* (2013.01); *G11C 11/4085* (2013.01); *G11C 11/4094* (2013.01); *G11C 11/4096* (2013.01); *H03K 19/01742* (2013.01)

(58) Field of Classification Search
CPC .... G11C 8/06; G11C 5/06; G11C 8/08; G11C 11/4085; G11C 11/4094; G11C 11/4096; H03K 19/01742
See application file for complete search history.

(56) References Cited

U.S. PATENT DOCUMENTS

| | | | |
|---|---|---|---|
| 7,506,135 B1 | 3/2009 | Mimar | |
| 7,584,343 B2 | 9/2009 | Kirsch | |
| 9,940,995 B1 | 4/2018 | Chandler et al. | |
| 10,410,690 B1 * | 9/2019 | Chang | G11C 11/56 |

(Continued)

FOREIGN PATENT DOCUMENTS

| | | |
|---|---|---|
| CN | 101291202 | 10/2008 |
| CN | 103823831 | 5/2014 |

(Continued)

OTHER PUBLICATIONS

U.S. Appl. No. 16/932,524, filed Jul. 17, 2020.
(Continued)

*Primary Examiner* — Viet Q Nguyen

(57) ABSTRACT

An example system implementing a processing-in-memory pipeline includes: a memory array to store data in a plurality of memory cells electrically coupled to a plurality of word-lines and a plurality of bitlines; a logic array coupled to the memory array, the logic array to implement configurable logic controlling the plurality of memory cells; and a control block coupled to the memory array and the logic array, the control block to control a computational pipeline to perform computations on the data by activating at least one of: one or more bitlines of the plurality of bitlines or one or more wordlines of the plurality of wordlines.

20 Claims, 7 Drawing Sheets

(56) References Cited

U.S. PATENT DOCUMENTS

| | | |
|---|---|---|
| 10,862,485 B1 | 12/2020 | Jarboe |
| 11,354,134 B1 | 6/2022 | Yudanov |
| 11,355,170 B1* | 6/2022 | Yudanov ............. G11C 11/4085 |
| 11,403,111 B2 | 8/2022 | Yudanov |
| 2008/0180450 A1 | 7/2008 | Dowling |
| 2009/0024826 A1 | 1/2009 | Zhang et al. |
| 2009/0207642 A1 | 8/2009 | Shimano et al. |
| 2010/0046306 A1 | 2/2010 | Takahashi |
| 2010/0198893 A1 | 8/2010 | Azadet et al. |
| 2010/0246243 A1 | 9/2010 | Kobatake |
| 2013/0311532 A1 | 11/2013 | Olsen |
| 2016/0155482 A1* | 6/2016 | La Fratta ............. G11C 7/06 365/189.011 |
| 2016/0173101 A1 | 6/2016 | Gao et al. |
| 2016/0293253 A1 | 10/2016 | Ogiwara et al. |
| 2017/0003966 A1 | 1/2017 | Haraden et al. |
| 2017/0083434 A1 | 3/2017 | Potash |
| 2017/0187397 A1 | 6/2017 | Kim |
| 2018/0358086 A1 | 12/2018 | Goel et al. |
| 2019/0065111 A1 | 2/2019 | Lea et al. |
| 2019/0066772 A1 | 2/2019 | Singh et al. |
| 2019/0115921 A1 | 4/2019 | Zhang |
| 2019/0196953 A1 | 6/2019 | Gu et al. |
| 2019/0213289 A1 | 7/2019 | Baeckler et al. |
| 2019/0279993 A1 | 9/2019 | Madurawe |
| 2019/0303749 A1 | 10/2019 | Appuswamy et al. |
| 2020/0075081 A1 | 3/2020 | Hush |
| 2020/0294580 A1 | 9/2020 | Raj et al. |
| 2021/0050040 A1 | 2/2021 | Ramesh |
| 2021/0134345 A1 | 5/2021 | Kwon et al. |
| 2021/0149984 A1 | 5/2021 | Luo |
| 2021/0349826 A1 | 11/2021 | Roy et al. |
| 2022/0019442 A1 | 1/2022 | Yudanov |
| 2022/0189531 A1 | 6/2022 | Yudanov |
| 2023/0010540 A1 | 1/2023 | Yudanov |

FOREIGN PATENT DOCUMENTS

| | | |
|---|---|---|
| CN | 105653474 | 6/2016 |
| CN | 106663459 A | 5/2017 |
| CN | 106814662 A | 6/2017 |
| CN | 107004433 A | 8/2017 |
| CN | 107408404 | 11/2017 |
| CN | 111124999 A | 5/2020 |
| CN | 111291859 A | 6/2020 |
| CN | 111724832 | 9/2020 |
| WO | 2021041654 | 3/2021 |

OTHER PUBLICATIONS

USPTO, Office Action for U.S. Appl. No. 16/932,524, dated Apr. 29, 2021.
USPTO, Notice of Allowance U.S. Appl. No. 16/932,524, dated Aug. 10, 2021.
USPTO, Notice of Allowance for U.S. Appl. No. 16/932,524, dated Dec. 8, 2021.
U.S. Appl. No. 17/123,829, filed Dec. 16, 2020.
USPTO, Office Action for U.S. Appl. No. 17/123,829, dated Sep. 21, 2021.
USPTO, Notice of Allowance for U.S. Appl. No. 17/123,829, dated Feb. 11, 2022.
U.S. Appl. No. 17/212,551, filed Mar. 25, 2021.
USPTO, Notice of Allowance for U.S. Appl. No. 17/212,551, dated Jan. 28, 2022.
Fujita, Toru, et al., 2016 IEEE International Parallel and Distributed Processing Symposium Workshops, Department of Information Engineering, Hiroshima University, "Bitwise Parallel Bulk Computation on the GPU, with Application to the CKY Parsing for Context-free Grammars", 2016, 10 pages.
Nishimura, Takahiro, et al., IEEE Xplore, 2017 IEEE International Parallel and Distributed Processing Symposium Workshops, "Accelerating the Smith-Waterman Algorithm Using Bitwise Parallel Bulk Computation Technique on GPU", 2 pages, [downloaded from the internet: Mar. 25, 2021].
Wikipedia, "CYK algorithm", 7 pages, [downloaded from the internet: Mar. 25, 2021].
CN Office Action for CN Application No. 202110805030.X, dated Sep. 30, 2022, 9 pages.
CN Office Action for CN Application No. 202111543795.7, dated Aug. 16, 2022, 9 pages.

* cited by examiner

RECONFIGURABLE PROCESSING-IN-MEMORY LOGIC

REFERENCE TO RELATED APPLICATION

This application is a continuation of U.S. patent application Ser. No. 17/123,829 filed on Dec. 16, 2020, issued U.S. Pat. No. 11,355,170 on Jun. 7, 2022, which is incorporated by reference herein.

TECHNICAL FIELD

Embodiments of the present disclosure are generally related to memory systems, and more specifically, are related to implementing reconfigurable processing-in-memory logic.

BACKGROUND

A computer system can include one or more processors (such as general purpose processors, which can also be referred to as central processing units (CPUs) and/or specialized processors, such as application-specific integrated circuits (ASICs), field programmable gate arrays (FPGAs), graphic processing units (GPUs), etc.), which are coupled to one or more memory devices and use the memory devices for storing executable instructions and data. In order to improve the throughput of the computer system, various solutions can be implemented for enabling parallelism in computations.

BRIEF DESCRIPTION OF THE DRAWINGS

The present disclosure will be understood more fully from the detailed description given below and from the accompanying drawings of some embodiments of the present disclosure.

DETAILED DESCRIPTION

Embodiments of the present disclosure are directed to implementing reconfigurable processing-in-memory (PIM) logic.

A computer system can include one or more processors (such as general purpose processors, which can also be referred to as central processing units (CPUs) and/or specialized processors, such as application-specific integrated circuits (ASICs), field programmable gate arrays (FPGAs), graphic processing units (GPUs), neural and artificial intelligence (AI) processing units (NPUs), etc.), which are coupled to one or more memory devices and use the memory devices for storing executable instructions and data. In order to improve the throughput of the computer system, various solutions can be implemented for enabling parallelism in computations. However, such solutions are often based on increasing the number of processing cores (such as GPU cores), thus increasing both the energy consumption and the overall cost of the computer system.

In order to improve the system throughput while avoiding exorbitant costs, embodiments of the present disclosure implement PIM operations by memory devices equipped with logic arrays and control blocks. The logic array can implement reconfigurable control logic, e.g., pull networks that control the memory array. The control block can manage the computations by activating certain wordlines and providing control signals to the logic array. The reconfigurable PIM logic can be utilized for implementing various computational pipelines, including highly parallel superscalar pipelines, vector pipelines, systolic arrays, hardware neural networks, and/or computational pipelines of other types, as described in more detail herein below.

Therefore, advantages of the systems and methods implemented in accordance with some embodiments of the present disclosure include, but are not limited to, providing more cost effective, with respect to various existing hardware implementations, systems and methods for implementing various computational pipelines. PIM systems implemented in accordance with embodiments of the present disclosure can be employed by embedded systems, circuit simulation or emulation systems, and various hardware accelerators, especially for algorithms requiring high degrees of parallelism. In some embodiments, PIM systems implemented in accordance with aspects of the present disclosure can outperform specialized processors (such as application-specific integrated circuits (ASICs), field programmable gate arrays (FPGAs), graphic processing units (GPUs), etc.) for applications requiring wide circuits and large amounts of memory.

Figure 1:
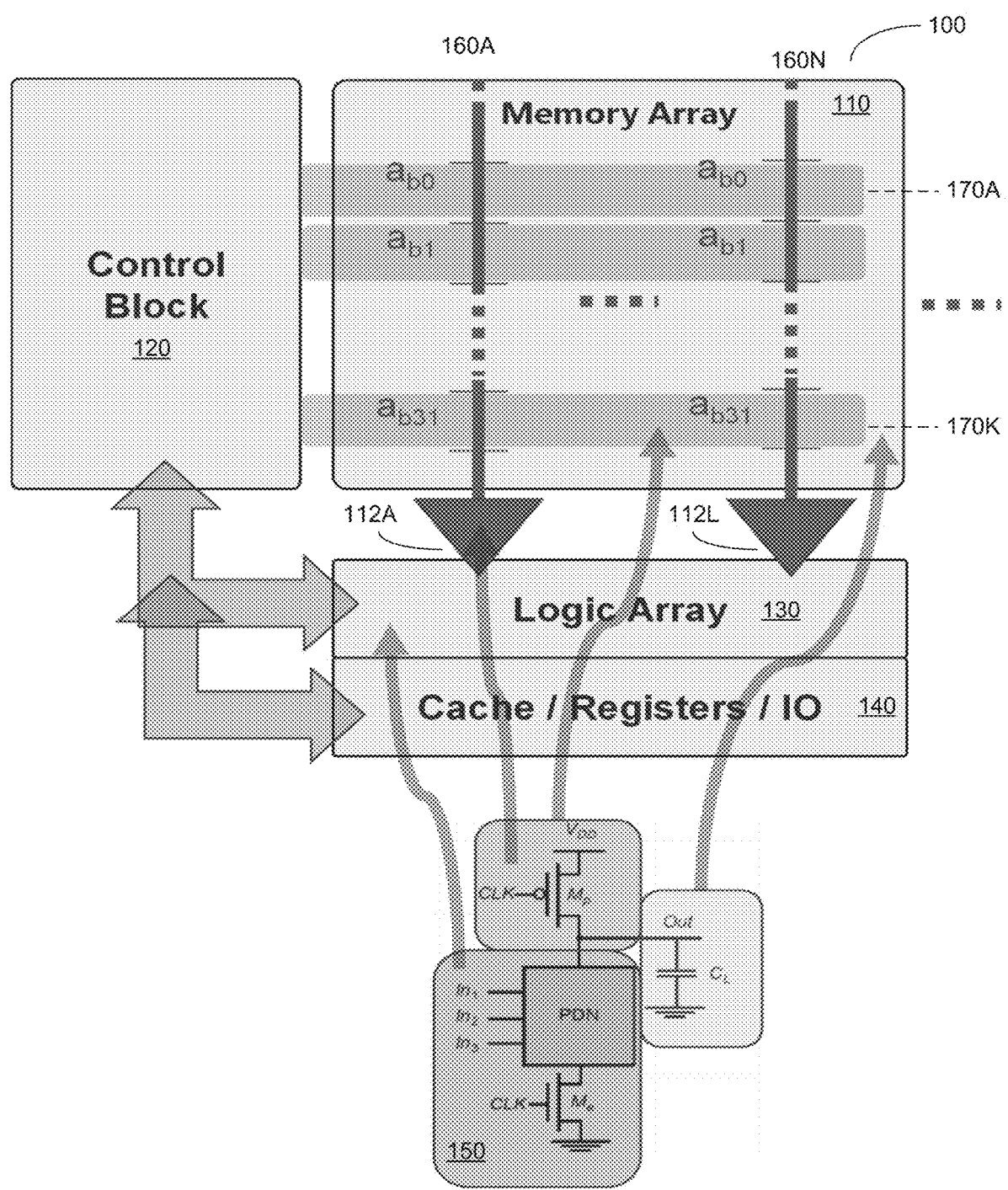
FIG. 1 illustrates a high level architectural diagram of an example processing-in-memory (PIM) system implemented in accordance with aspects of the present disclosure.

FIG. 1 illustrates a high-level architectural diagram of an example PIM system 100 implemented in accordance with aspects of the present disclosure. As shown in FIG. 1, the PIM system 100 includes the memory array 110 coupled to the control block 120, the logic array 130, and cache/registers memory 140. "Coupled to" herein refers to electrical connections between components, including indirect connections via one or more intervening components and direct connections (i.e., without intervening components).

In one embodiment, the PIM system 100 can be implemented as one or more integrated circuits located on a single chip. In another embodiment, the PIM system 100 can be implemented as a System-on-Chip, which, in addition to the components shown in FIG. 1, can include one or more processing cores and one or more input/output (I/O) interfaces. In some embodiments, the PIM system 100 can include various other components, which are omitted from FIG. 1 for clarity and conciseness.

The memory array 110 can be provided by a dynamic random-access memory (DRAM) array, which is a matrix of memory cells joined along the rows by conductors referred to as "wordlines" and along the columns by conductors referred to as "bitlines." Each memory cell includes a capacitor that holds the electric charge and a transistor that acts as a switch controlling access to the capacitor.

In another embodiment, the memory array 110 can be provided by resistive random-access memory (ReRAM) including but not limited to 3D X-point memory, which is a matrix of memory cells addressable by rows (wordlines) and columns (bitlines), including embodiments where rows and columns are symmetric (a row can play a role of column and a column can play a role of row). Each memory cell includes a resistive memory cell that holds its conductivity or resistivity state.

In yet another embodiment, the memory array 110 can be provided by Flash memory including but not 3D NAND Flash storage, which is a 3D matrix of memory cells addressable by planes (wordlines) and NAND strings (bitlines). Each memory cell includes a Flash transistor with a floating gate that holds its threshold voltage state (Vt) depending on the charge stored in a floating gate of the transistor.

In yet another embodiment, the memory array 110 can be provided by non-volatile hybrid FeRAM-DRAM memory (HRAM) array, which is a matrix of memory cells addressable by rows (wordlines) and columns (bitlines). Each memory cell includes a ferroelectric capacitor that holds the electric charge and a transistor that acts as a switch controlling access to the ferroelectric capacitor.

The memory array 110 can be employed for storing the data utilized for the computations, as well as the computation results. In some embodiments, the memory array 110 can be further implement configurable logic that employs pull networks (pull-up networks (PUNs) and/or pull-down networks (PDNs)) utilized for controlling the memory cells of the memory array 110, as described in more detail herein below.

In some embodiments, the PIM system 100 can further include a plurality of sense amplifiers 112A-112L coupled to the memory array. A sense amplifier can be employed to sense, from a selected bitline, a low power signal encoding the content of the memory cell and amplify the sensed signal to a recognizable logical voltage level.

The cache/registers memory 140 can be implemented by a static random access memory (SRAM) array or by low-latency magneto-resistive random-access memory (RAM), including but not limited to magnetic tunnel junction (MTJ) memory cells. Cache/registers memory 140 can be employed for caching a subset of the information stored in the memory array 110. The SRAM array 140 can include multiple cache lines that can be employed for storing copies of the most recently and/or most frequency accessed data items residing in the memory array 110. In various illustrative examples, the cache can be utilized to store intermediate results produced by intermediate stages of the computational pipeline, and/or signals of the logic array 130. At least part of the SRAM array 140 can be allocated for registers, which store values of frequently updated memory variables utilized for computations. In some embodiments, the SRAM array 140 can comprise with logic array 130, thus forming a unified cache-logic fabric.

Figure 2B:
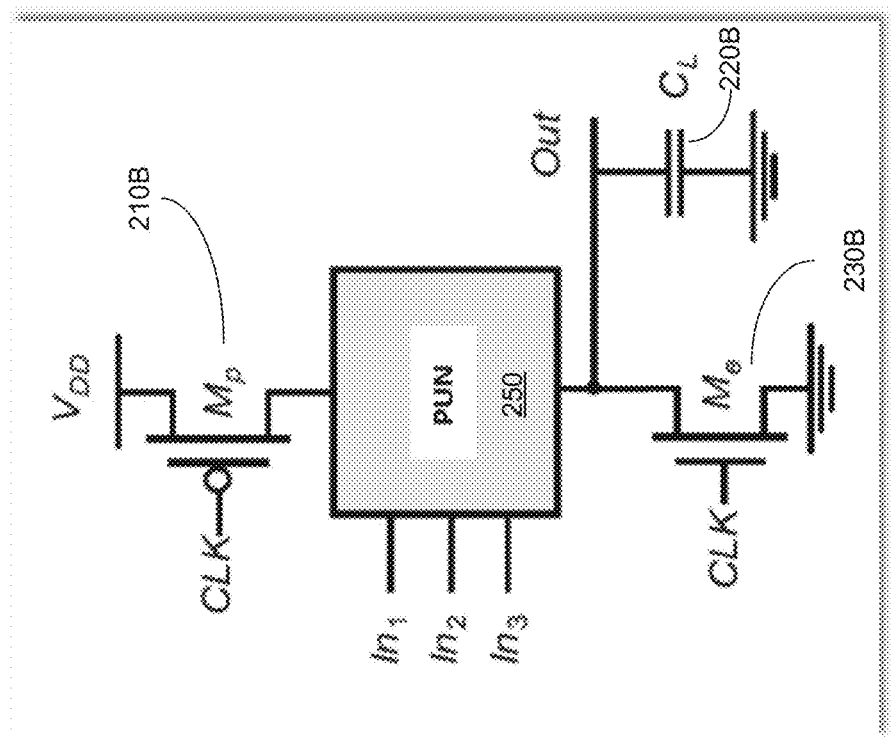
FIG. 2B schematically illustrates a high-level component diagram of a pull-up network (PUN)-based configurable logic implemented in accordance with aspects of the present disclosure.
Figure 2A:
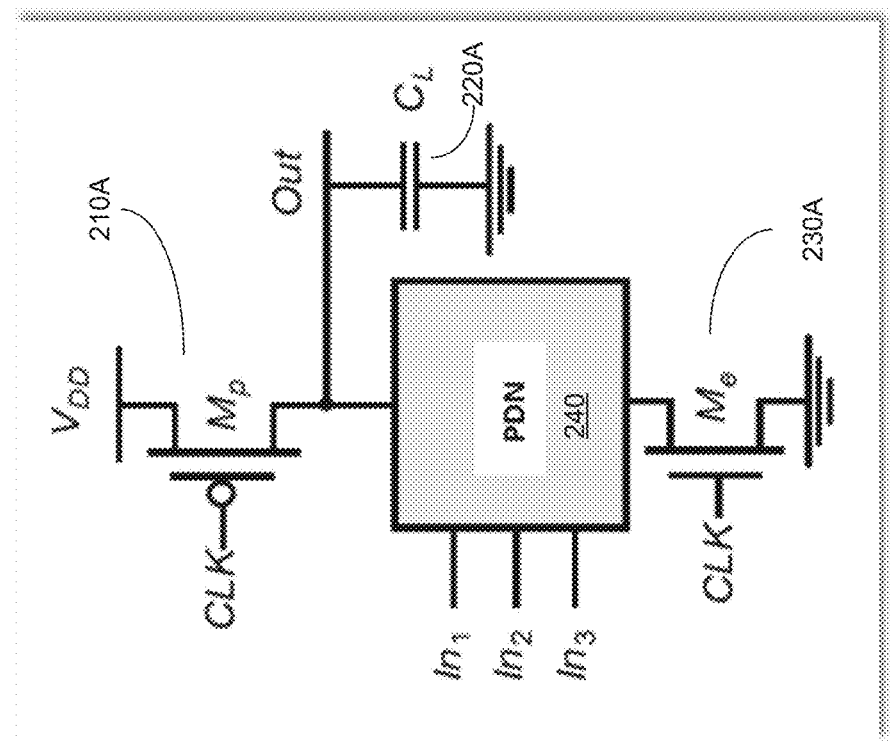
FIG. 2A schematically illustrates a high-level component diagram of a pull-down network (PDN)-based configurable logic implemented in accordance with aspects of the present disclosure.

The logic array 130 can be employed for implementing the pull networks controlling memory cells of the memory array 110, as schematically illustrated by FIGS. 2A-2B. In particular, FIG. 2A schematically illustrates a high-level component diagram of a PDN-based configurable logic 200A implemented in accordance with aspects of the present disclosure. As schematically illustrated by FIG. 2A, a memory cell, which is formed by the access transistor 210A coupled to the capacitor 220A, is controlled by the PDN 240. The configurable logic operates in two phases: pre-charge and evaluation, each of which can be performed on a corresponding clock cycle.

When the clock signal is low, thus opening the transistor 210A and closing the transistor 230A, the pre-charge phase is performed: the discharge path to the ground is blocked by the PDN 240, and the capacitor 220A is "pulled up," i.e., charged to the logical "1" level by the technology-specific nominal power supply voltage ($V_{dd}$) flowing through the transistor 210A. Conversely, the evaluation phase is performed when clock signal is high, thus closing the transistor 210A and opening the transistor 230A, a conditional path to the ground is enabled through the transistor 230A and the PDN 240. The capacitor 220A is discharged depending on the inputs $In_1$, $In_2$, . . . , $In_n$, which define the state of the PDN 240, thus defining a path to the ground. In some instances, that path can be partial, thus providing multi-level voltage evaluation.

FIG. 2B schematically illustrates a high-level component diagram of a PUN-based configurable logic 200B implemented in accordance with aspects of the present disclosure. As schematically illustrated by FIG. 2B, the memory cell, which is formed by the access transistor 210B coupled to the capacitor 220B, is controlled by the PUN 250. The configurable logic operates in two phases: pre-charge and evaluation, each of which can be performed on a corresponding clock cycle.

The pre-charge phase is performed when the clock signal is high, thus blocking the charge path by closing the transistor 210B: the capacitor 220B is "pulled down," i.e., discharged to the ground through the transistor 230B. Conversely, the evaluation phase is performed when the clock signal is low, thus enabling a conditional path to the power supply voltage ($V_{dd}$) by closing the transistor 230B and opening the transistor 210B. Accordingly, the capacitor 220B is charged depending on the inputs $In_1$, $In_2$, . . . , $In_n$, which define the state of the PUN 250, thus defining a path to the ground. In some instances, that path can be partial, thus providing multi-level voltage evaluation.

Referring again to FIG. 1, the logic array 130 can be employed for implementing the configurable logic (e.g., represented by a pull network comprising a PDN, a PUN, or their combination) controlling operations of the memory array 110. While the illustrative example of FIG. 1 shows an example PDN 150, in various other implementations, the logic array can implement both PDNs and PUNS and/or their combinations for controlling the memory array 110.

As noted herein above, the configurable logic implemented by the logic array 130 operates in two phases: pre-charge and evaluation, each of which can be performed on a corresponding clock cycle. During the pre-charge phase, a chosen bitline 160 is conditionally pre-charged to a certain voltage by being coupled to a PUN/PDN capacitor. Alternatively, a bitline can be a part of the PUN/PDN capacitor, or can perform as the PUN/PDN capacitor. Furthermore, the logic array 130 may cause at least one word-line 170 to be open during the pre-charge, and thus the corresponding row(s) of memory cells is (are) pre-charged along with the column of memory cells that are addressed by the chosen bitline. The number of pre-charged rows can be used for balancing the amount of charge during the evaluation phase. Furthermore, different rows of memory cells can be pre-charged to different charge levels, which can be specified by the inputs provided by the control block 120. Thus, groups of memory cells on selected bitlines can be pre-charged with different logic according to the states of the respective pull networks. In some implementations, the pre-charge phase may be integrated into the memory interface protocol, and thus may be performed whenever a pre-charge instruction is issued by the memory controller.

During the evaluation phase, a chosen wordline conditionally opens and a corresponding row of memory cells is evaluated with the PDN 150, PUN (not shown in FIG. 1 for clarity and conciseness), or combination thereof. As a result, the charge held by the memory cells is either retained or leaked, depending on the state of the pull network. The result of the evaluation phase, which is the state of the bitline, can be recorded in a chosen row of the memory array 110. The process can be repeated for other rows of interest. Multiple passes can be performed on subsequent results by pull networks in order to compute the final result. The inputs $In_1$, $In_2$, . . . , $In_n$ controlling the pull networks can be received from the control block (which, in turn, can receive its inputs from an external source) or can be routed, sequentially or in parallel, from a chosen bitline or a group of bitlines, which can be coupled to memory cells by opening certain wordlines as controlled by the control block.

In an illustrative example, a XOR logic gate can be implemented by pre-charging a first memory cell, access to which is controlled by a first word line on a chosen bitline, to a certain value and then accessing the value stored in the first memory cell by opening the first wordline, followed by evaluating the memory cell by another value that is supplied to the bitline directly or stored in a second memory cell coupled to the bitline. Observed voltage fluctuations would indicate that the first and second values are different, and thus the output of the XOR logic gate would be logical "1." Conversely, if no voltage fluctuations are observed, the values are indistinguishable, and the output of the XOR logic gate would be logical "0." In another example, a XOR logical gate can be similarly implemented by utilizing two adjacent bitlines, e.g. by coupling them in the same manner as described above with respect to first and second memory cells, and then routing this coupling via PUN/PDN components. In various illustrative examples, addition and multiplication operations may be performed by combining multiple XOR gates, each of which represents a half adder.

In some implementations, the configurable logic (e.g., pull networks) controlling the memory cells can be implemented within the memory array 110. The pull network inputs $In_1$, $In_2$, . . . , $In_n$ can be routed to respective wordlines, and the pull network logic can be stored in memory cells addressed by a chosen bitline at corresponding intersections with the wordlines, by pre-charging the memory cells to various charge values (voltage levels). During the evaluation phase, the wordlines will be open, this establishing new voltage states of the chosen bitline coupled to respective memory cells.

In an illustrative example, the in-memory configurable logic may be utilized for implementing a simple inverter. At the pre-charge phase, a selected memory row can be pre-charged to zero or negative voltage and its wordline can be closed thereafter. Furthermore, a selected bitline can be pre-charged to a positive voltage. During the evaluation phase, the input controlling the configurable logic is routed to the wordline: if the input is logical "0," then the wordline remains closed and the bitline remains at the positive voltage, while if the input is logical "1," then the wordline opens, thus causing the charge from the memory cell to cancel the charge on the bitline, which would invert its state from the positive to zero or negative state. Multiple bitlines can be engaged this way in parallel, thus producing a high-bandwidth logic array with in-memory configurable logic. As noted herein above, the inputs controlling the external logic can be received from the control block (which, in turn, can receive its inputs from an external source) or can be routed, sequentially or in parallel, from a chosen bitline or a group of bitlines.

Figure 3:
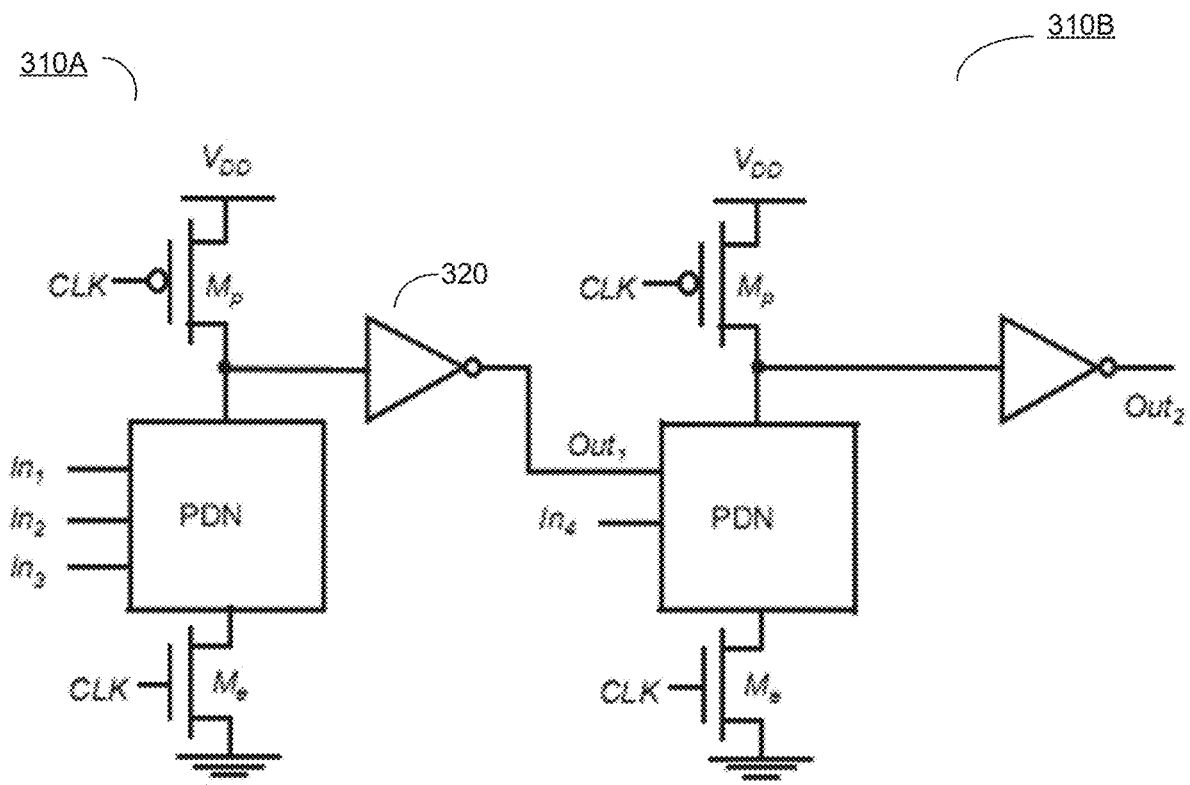
FIG. 3 illustrates a high-level component diagrams of a serially connected pull-network-based configurable logic implemented in accordance with aspects of the present disclosure.

Referring again to implementations of the configurable logic (e.g., pull networks) by the logic array 130, pull network-based configurable logic, such as example configurable logic cells 200A and 200B, can be connected in series via a buffer (e.g., an inverter), as schematically illustrated by FIG. 3. In the illustrative example of FIG. 3, the PDNs 310A and 310B are connected in series via the logical inverter 320.

Such pull network cascading allows implementation of complex sequential circuits for implementing parallel computational pipelines, including two-dimensional pipelines, such as systolic arrays. "Systolic array" herein refers to a collection of processing elements arranged in a two-dimensional grid (or higher-dimensional grid in some cases). Each processing element in a systolic array implements a computational function and stores and forwards data to other elements. Thus, a systolic array produces $A^B$ operations in a single clock cycle, where A is an array width and B is the number of dimensions.

Figure 4:
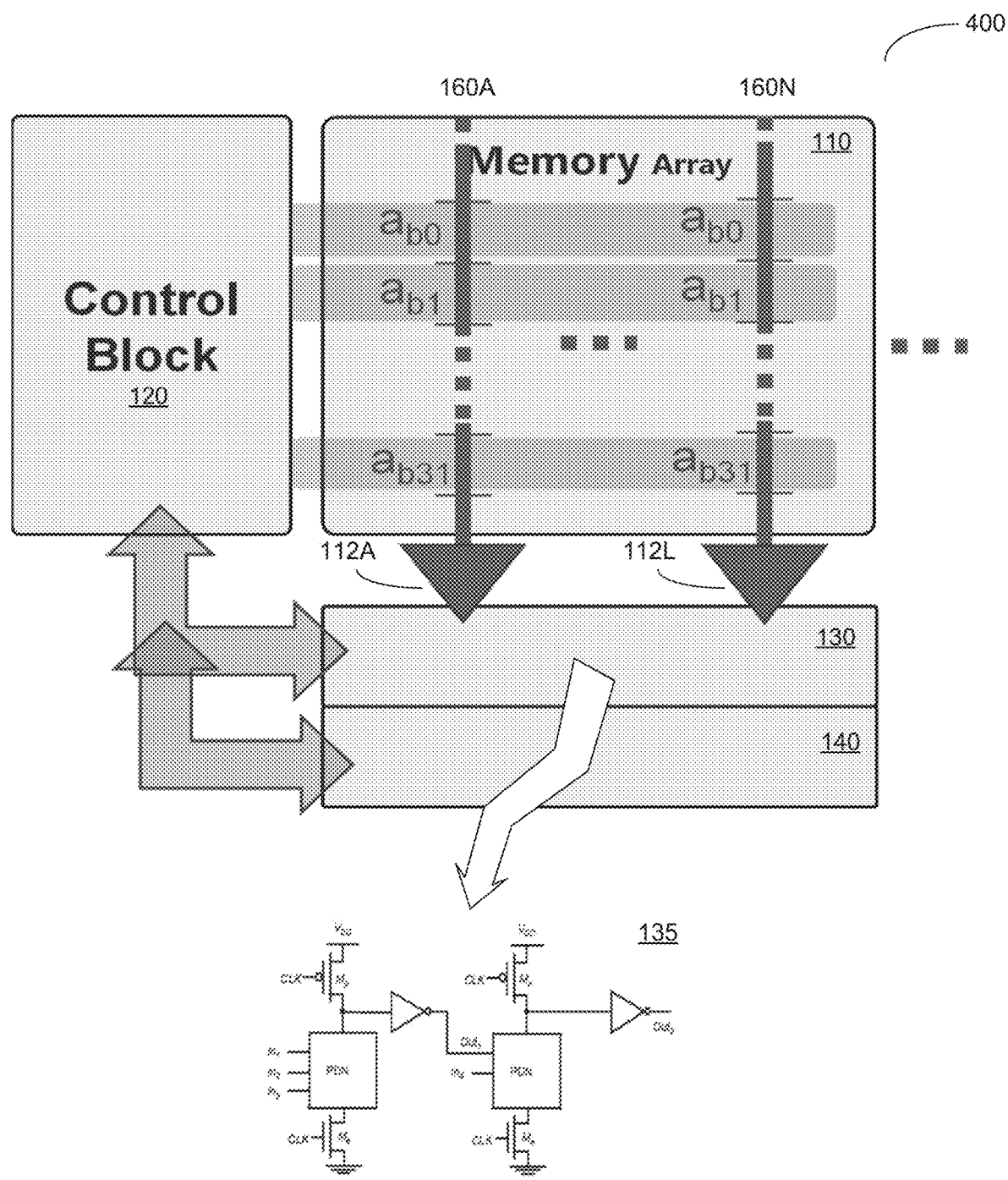
FIG. 4 illustrates a high-level architectural diagram of an example PIM system utilizing cascaded control logic implemented in accordance with aspects of the present disclosure.

FIG. 4 illustrates a high-level architectural diagram of an example PIM system 400 utilizing cascaded control logic implemented in accordance with aspects of the present disclosure. As shown in FIG. 4, the PIM system 400 includes the memory array 110 coupled to the control block 120, the logic array 130, and cache/registers memory 140. The logic array 130 can implement the cascaded configurable logic 135, which includes multiple configurable logic cells connected in series, as described herein above with reference to FIG. 3.

In some implementations, the cascaded configurable logic 135 can be integrated with the sense amplifier array, which includes the sense amplifiers 112A-112L. Such integration allows configurable routing of the configurable logic inputs and outputs to the bitlines 160A-160N, cache, row buffers, and/or the control block 120. In such configurations, the data movement can be performed in both directions, i.e., horizontally (along the sense amplifier array and the row buffer) and vertically (along the bitlines 160A-160N). Furthermore, during execution, new data can be created and consumed at every cell of the logic array, which is facilitated by high-bandwidth bidirectional input/output that is provided by interfacing with the row buffers, the sense amplifier array and the memory array circuitry.

Since multiple bitlines can be pre-charged within a single clock cycle and evaluated within the next clock cycle, the updated state would propagate within a given row (which may include thousands of bitlines) in a single clock cycle, thus facilitating creation of highly parallel computational pipelines. In some implementations, the state would also propagate vertically (along bitlines) within a single clock cycle, thus facilitating creation of systolic arrays.

In some implementations, at any desired clock cycle the whole state of the logic array can be check-pointed, e.g., by storing to the memory array. One of the saved checkpoint states would then serve as a restore point in case of a failure detected in the pipeline.

In some implementations, the configurable logic 135 implemented by the control block 130 can be configured to read their configuration data from specified bitlines of the memory array 110. Thus the control logic can be configured, in several clock cycles, to implement a desired computational pipeline.

Furthermore, in various implementations, the logic array 130 can further include various logic components, such as full adders, half adders, multipliers, D-type flip-flops, and/or other components for implementing logic operations. The logic operations can implement reconfigurable processing logic by performing the logic operations on the memory array 110 as they are activated by the control block 120 and/or on other data stored in the memory array 110 and/or in the cache/registers memory 140.

The logic array 130 can receive the inputs from the control block 120 and/or from the memory array 110. The control block 120 can process executable instructions (sequentially or in parallel), which can be stored in the memory array 110, thus implementing a von Neumann architecture in a manner that is conceptually similar to a regular computational pipeline (e.g. CPU or GPU pipeline): instruction fetch, decode, configure, and execute. Configuring an instruction can involve activating, by the control block 120, certain bitlines and wordlines. Executing the instruction(s) involves retrieving, by the logic array 130, the contents stored in the memory cells addressed by the activated bitlines and wordlines and performing, on the retrieved data, the logic operations specified by the pull networks 150. The result of the computations can be stored in the memory array 110 and/or outputted via an input/output (I/O) interface coupled to the memory (not shown in FIG. 1 for clarity and conciseness). Thus, the control block 120 can implement a computational pipeline by activating certain bitlines and wordlines.

The wordline drivers of the control block 120 that activate specific wordlines can reside on the same die with the memory array. In some embodiments, the processing core of the control block 120 can be also located on the same die, thus implementing a system-on-chip. Alternatively, the processing code can be located on a different die, as long as a physical connection providing a sufficient bandwidth and throughput between the processing core and the memory array is available. In some embodiments, the control block can be implemented by an external processing core, such as a dedicated core of a CPU, which is controlled by a software driver.

In some embodiments, the control block 120 can receive its instructions for execution from the memory array 110 either via the logic array 130 or wordlines of memory array 110. The latter is possible if the memory array 110 is provided by resistive random-access memory (ReRAM), which is a matrix of memory cells addressable by rows (wordlines) and columns (bitlines), where rows and columns are symmetric (i.e., a row can play a role of a column and a column can play a role of a row). In this case, the sense amplifiers/drivers of logic array 130 provide sufficient driving strength via bitlines in order for sense amplifiers/drivers of the control block 120 to sense data.

Furthermore, due to symmetricity of data access, the functions of logic array 130 and control block 120 can in some embodiments be merged such that control block 120 in FIG. 1 can also implement functions of logic array 130, and logic array 130 in FIG. 1 can also implement functions of control block 120. As a result, such embodiments may have symmetric two blocks per array (connected to the memory array 110 from the left and bottom of the memory array 110). Furthermore, in some embodiments, the two blocks can be further expanded to four symmetrical blocks (connected to the memory array 110 from left, right, bottom, and top of the memory array 110).

In some embodiments, the PIM system can be implemented as a layered or stacked chip, in which the memory array 110 and the control block 120 are located within two different layers of the same die.

In some embodiments, the control block 120 can implement a simple reduced instruction set computer (RISC) pipeline with no speculation and no instruction-level parallelism. In other embodiments, the control block 120 can implement at least some instruction-level parallelism and out-of-order execution, thus implementing Tomasulo or scoreboarding-type computational pipelines (i.e., complex instruction set computer (CISC) pipelines).

In some embodiments, the control block 120 can implement a Single Instruction Multiple Data (SIMD) computational pipeline, by employing multiple processing elements that simultaneously perform the same operation on multiple data items simultaneously, as described in more detail herein below. Such embodiments can implement very efficient solutions for matrix multiplication and dot-product operations. A SIMD-style pipeline can be RISC or CISC type. Furthermore, a SIMD pipeline can be implemented as a very long instruction word (VLIW) pipeline for exploiting more instruction-level parallelism.

Figure 5:
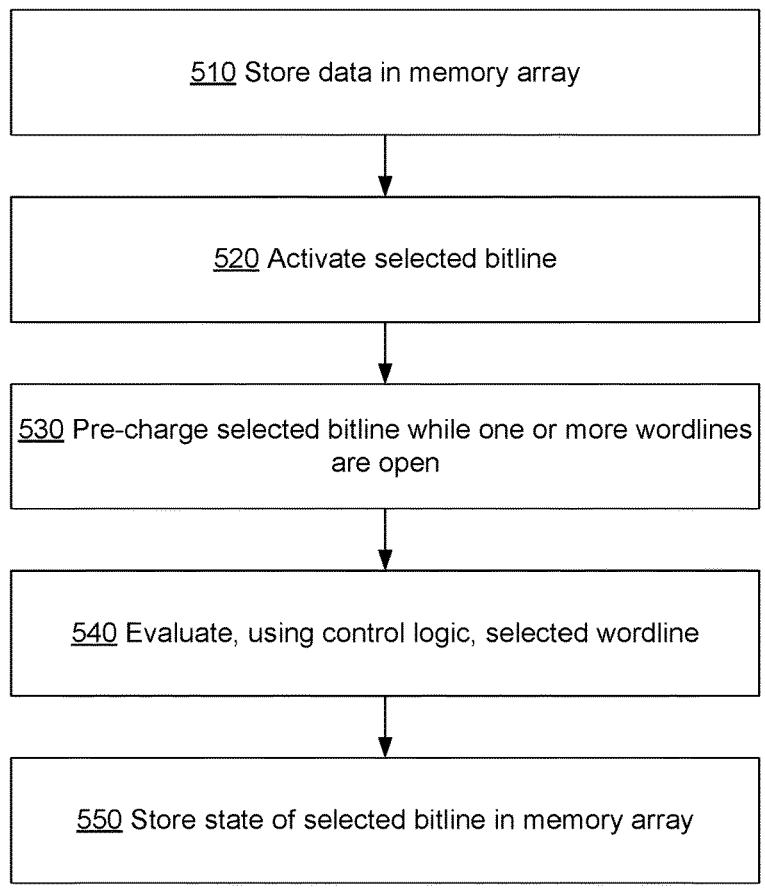
FIG. 5 is a flow diagram of an example method of implementing a computational pipeline by a PIM system operating in accordance with some embodiments of the present disclosure.

FIG. 5 is a flow diagram of an example method 500 of implementing a computational pipeline by a PIM system operating in accordance with some embodiments of the present disclosure. As noted herein above, the PIM system can include a memory array coupled to a control block, a logic array, and cache/registers memory. The computational pipeline can be specified by a sequence of executable instructions stored in the memory array or received via an I/O link.

In some embodiments, the method 500 is performed by the PIM system 100 of FIG. 1 and/or PIM system 400 of FIG. 4. Although the operations of the method are shown in a particular sequence or order, the order of the operations can, unless otherwise specified, be modified. Thus, the illustrated embodiments should be understood only as examples, and the illustrated operations can be performed in a different order, while some operations can be performed in parallel. Additionally, in some embodiments, one or more operations can be omitted or more operations can be inserted. Thus, not all illustrated operations are required in every embodiment, and other process flows are possible.

At operation 510, the PIM system implementing the method stores data in a memory array comprising a plurality of memory cells grouped into a plurality of wordlines and a plurality of bitlines. The data may include one or more initial data items for computations and one or more configuration data items for the control logic implemented by the memory array and/or the logic array of the PIM system.

At operation 520, the control block of the PIM system activates a selected bitline of the plurality of bitlines. The bitline to be activated may be specified by a control input received from the control block of the PIM system, as described in more detail herein above.

At operation 530, the PIM system pre-charges the selected bitline to a certain charge level (e.g., using a voltage level specified by a control input received from the control block), while at least one wordline of the plurality of wordlines is optionally open during the pre-charge operation, as described in more detail herein above. In some implementations, no wordlines can be open, while the bitline itself can be used as a capacitor for pre-charge operation.

At operation 540, the PIM system evaluates, by the configurable logic, a row of memory cells addressed by a selected wordline which provides coupling of bitline with corresponding memory cell, and which may be specified by a control input received from the control block, as described in more detail herein above.

At operation 550, the PIM system stores, in an available memory cell accessible via a wordline of the plurality of wordlines, a state of the selected bitline. The pre-charge, evaluate, and store operations may be repeated for multiple wordlines of interest, which may be specified by a control input received from the control block, as described in more detail herein above.

Figure 6:
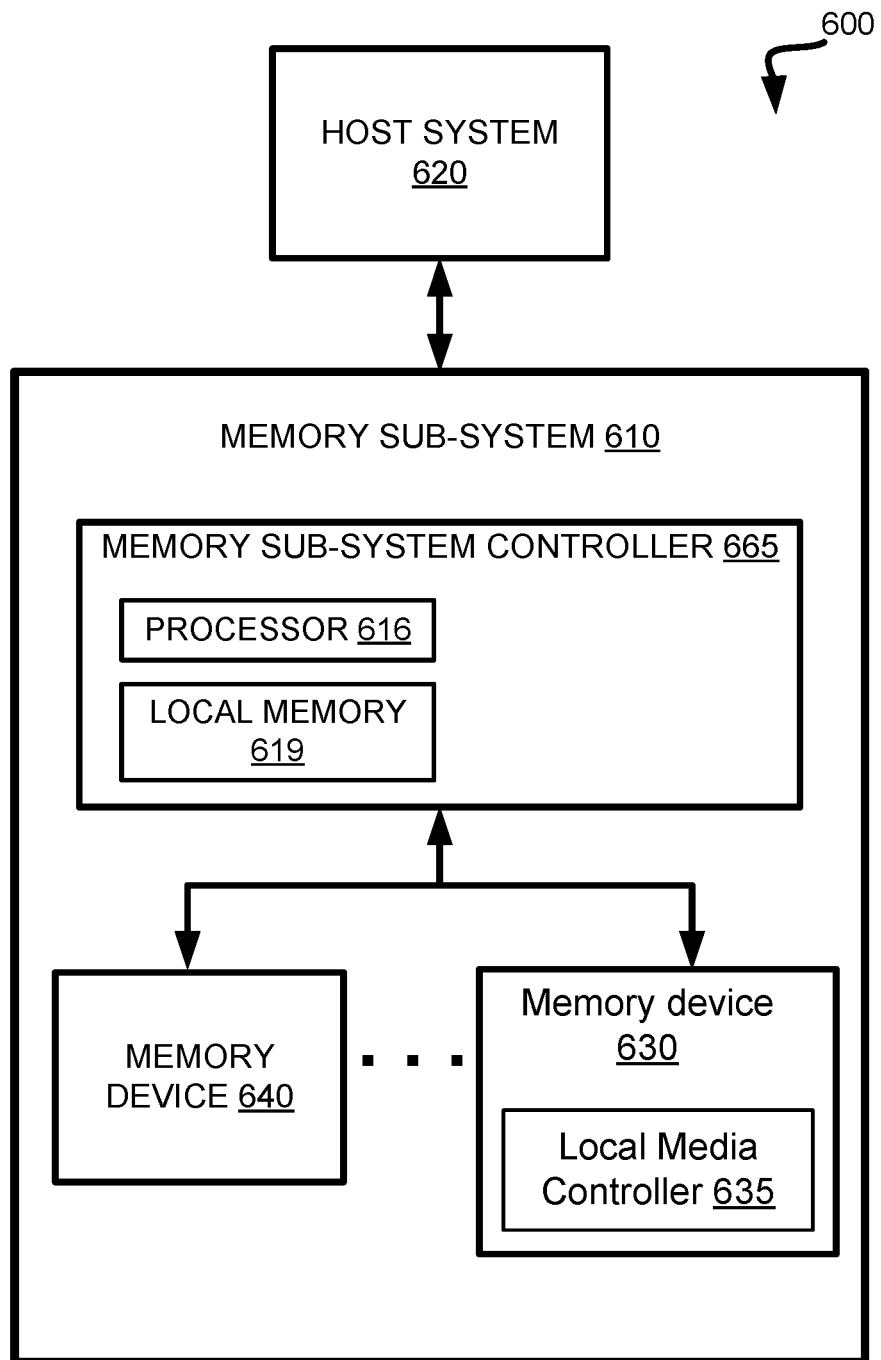
FIG. 6 illustrates an example computing system that includes a memory sub-system implemented in accordance with some embodiments of the present disclosure.

FIG. 6 illustrates an example computing system 600 that includes a memory sub-system 610 implemented in accordance with some embodiments of the present disclosure. The memory sub-system 610 can include media, such as one or more volatile memory devices (e.g., memory device 640), one or more non-volatile memory devices (e.g., memory device 630), or a combination of such. In some embodiments, one or more memory devices 640 can be utilized for implementing PIM systems operating in accordance with one or more aspects of the present disclosure. Accordingly, one or more memory devices 640 can each include a memory array coupled to a control block, a logic array, and cache/registers memory, as described in more detail herein above with references to FIG. 1.

The memory sub-system 610 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 600 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device (e.g., a processor).

The computing system 600 can include a host system 620 that is coupled to one or more memory sub-systems 610. In some embodiments, the host system 620 is coupled to different types of memory sub-systems 610. FIG. 6 illustrates one example of a host system 620 coupled to one memory sub-system 610. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 620 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 620 uses the memory sub-system 610, for example, to write data to the memory sub-system 610 and read data from the memory sub-system 610.

The host system 620 can be coupled to the memory sub-system 610 via a physical host interface. Examples of a physical host interface include, but are not limited to, a serial advanced technology attachment (SATA) interface, a peripheral component interconnect express (PCIe) interface, CXL interface, CCIX interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), etc. The physical host interface can be used to transmit data between the host system 620 and the memory sub-system 610. The host system 620 can further utilize an NVM Express (NVMe) interface to access components (e.g., memory devices 630) when the memory sub-system 610 is coupled with the host system 620 by the PCIe interface 105. The physical host interface 105 can provide an interface for passing control, address, data, and other signals between the memory sub-system 610 and the host system 620. FIG. 6 illustrates a memory sub-system 610 as an example. In general, the host system 620 can access multiple memory sub-systems via a same communication connection, multiple separate communication connections, and/or a combination of communication connections.

In some embodiments, a dedicated processing core of a CPU of the host system 620 can be controlled by a software driver to implement the functions of the PIM control block 120 of FIG. 1, as described in more detail herein above.

The memory devices 630, 640 can include any combination of the different types of non-volatile memory devices and/or volatile memory devices. The volatile memory devices (e.g., memory device 640) can be, but are not limited to, random access memory (RAM), such as dynamic random access memory (DRAM) and synchronous dynamic random access memory (SDRAM).

Some examples of non-volatile memory devices (e.g., memory device 630) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 630 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 630 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 630 can be grouped as pages that can refer to a logical unit of the memory device used to store data. With some types of memory (e.g., NAND), pages can be grouped to form blocks.

Although non-volatile memory devices such as 3D cross-point array of non-volatile memory cells and NAND type memory (e.g., 2D NAND, 3D NAND) are described, the memory device 630 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 665 can communicate with the memory devices 630 to perform operations such as reading data, writing data, or erasing data at the memory devices 630 and other such operations. The memory sub-system controller 665 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 665 can be a microcontroller, special purpose logic circuitry (e.g., a field programmable gate array (FPGA), an application specific integrated circuit (ASIC), etc.), or other suitable processor.

The memory sub-system controller 665 can include a processor 616 (e.g., a processing device) configured to execute instructions stored in a local memory 619. In the illustrated example, the local memory 619 of the memory sub-system controller 665 includes an embedded memory configured to store instructions for performing various processes, operations, logic flows, and routines that control operation of the memory sub-system 610, including handling communications between the memory sub-system 610 and the host system 620. In some embodiments, the processor 616 can be controlled by a software driver to implement the functions of the PIM control block 120 of FIG. 1, as described in more detail herein above.

In some embodiments, the local memory 619 can include memory registers storing memory pointers, fetched data, etc. The local memory 619 can also include read-only memory (ROM) for storing micro-code. While the example memory sub-system 610 in FIG. 6 has been illustrated as including the controller 665, in another embodiment of the present disclosure, a memory sub-system 610 does not include a controller 665, and can instead rely upon external control (e.g., provided by an external host, or by a processor or controller separate from the memory sub-system).

In general, the memory sub-system controller 665 can receive commands or operations from the host system 620 and can convert the commands or operations into instructions or appropriate commands to achieve the desired access to the memory devices 630. The memory sub-system controller 665 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 630. The memory sub-system controller 665 can further include host interface circuitry to communicate with the host system 620 via the physical host interface. The host interface circuitry can convert the commands received from the host system into command instructions to access the memory devices 630 as well as convert responses associated with the memory devices 630 into information for the host system 620.

The memory sub-system 610 can also include additional circuitry or components that are not illustrated. In some embodiments, the memory sub-system 610 can include a cache or buffer (e.g., DRAM) and address circuitry (e.g., a row decoder and a column decoder) that can receive an address from the controller 665 and decode the address to access the memory devices 630.

In some embodiments, the memory devices 630 include local media controllers 635 that operate in conjunction with memory sub-system controller 665 to execute operations on one or more memory cells of the memory devices 630. An external controller (e.g., memory sub-system controller 665) can externally manage the memory device 630 (e.g., perform media management operations on the memory device 630). In some embodiments, memory sub-system 610 is a managed memory device, which is a raw memory device 630 having control logic (e.g., local media controller 635) on the die and a controller (e.g., memory sub-system controller 665) for media management within the same memory device package. An example of a managed memory device is a managed NAND (MNAND) device.

Figure 7:
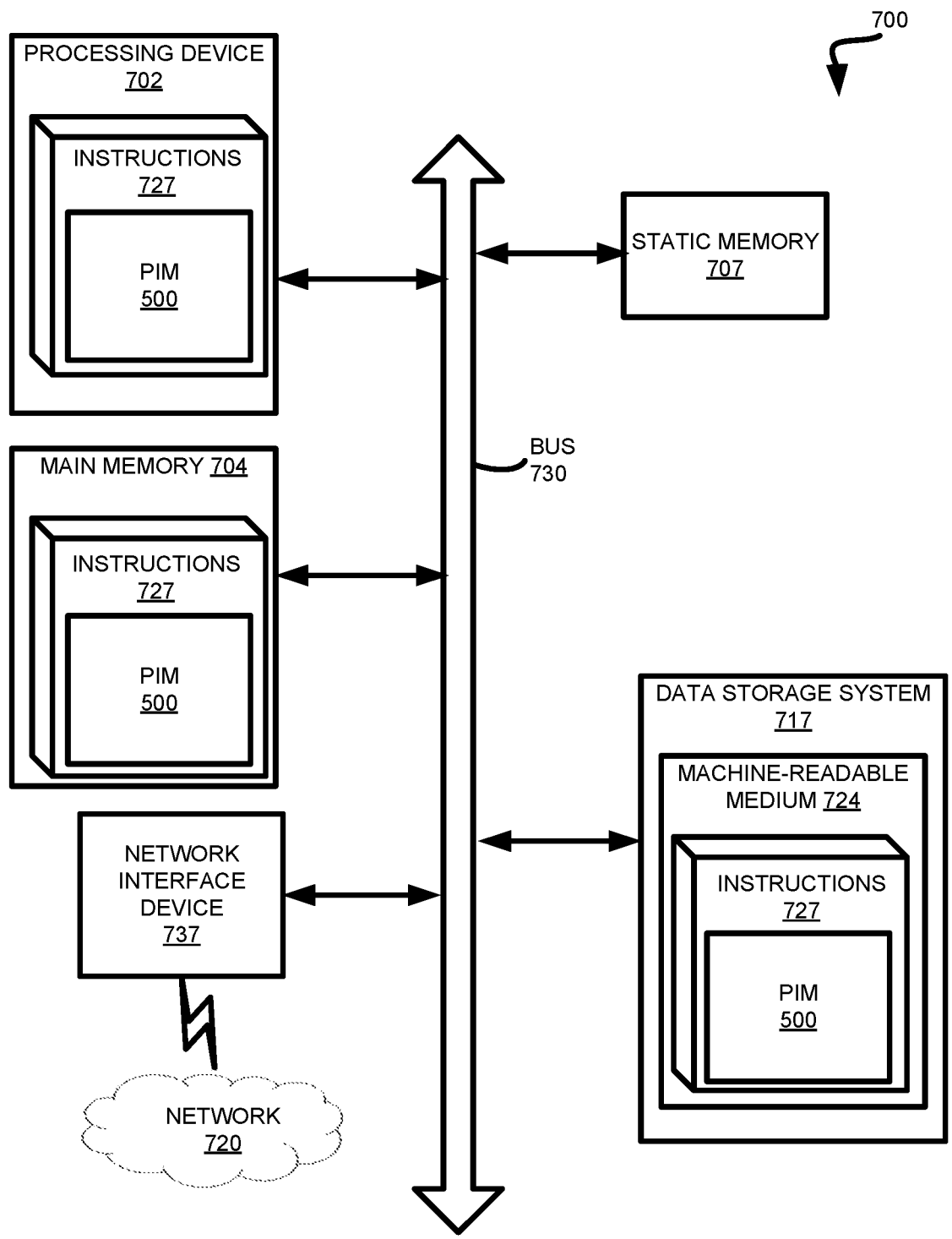
FIG. 7 is a block diagram of an example computer system in which embodiments of the present disclosure can operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 6) that includes, is coupled to, or utilizes a memory sub-system (e.g., the memory sub-system 110 of FIG. 6) or can be used to perform the operations of a controller.

In alternative embodiments, the machine can be connected (e.g., a network interface device 737 coupled to the network 720) to other computer system in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 707 (e.g., flash memory, static random access memory (SRAM), etc.), and a data storage system 717, which communicate with each other via a bus 730.

Processing device 702 represents one or more general-purpose processing devices such as a microprocessor, a CPU, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 727 for performing the operations and steps discussed herein. In some embodiments, a dedicated processing core of a CPU 702 can be controlled by a software driver to implement the functions of the PIM control block 120 of FIG. 1. In an illustrative example, the software driver can implement the example method 500, as described in more detail herein above.

The data storage system 717 can include a machine-readable storage medium 724 (also known as a computer-readable medium) on which is stored one or more sets of instructions 727 or software embodying any one or more of the methodologies or functions described herein. The instructions 727 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 717, and/or main memory 704 can correspond to the memory sub-system 610 of FIG. 6.

In one embodiment, the instructions 727 include instructions to implement the example method 500 of implementing a computational pipeline by a PIM system operating in accordance with some embodiments of the present disclosure. While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the present disclosure have been described with reference to specific example embodiments thereof. It will be evident that various modifications can be made thereto without departing from the broader spirit and scope of embodiments of the present disclosure as set forth in the following claims. The specification and drawings are, accordingly, to be regarded in an illustrative sense rather than a restrictive sense.

What is claimed is:

1. A system, comprising:
    a memory array to store data in a plurality of memory cells electrically coupled to a plurality of wordlines and a plurality of bitlines;
    a sense amplifier array coupled to the memory array;
    a logic array integrated with the sense amplifier array, the logic array to implement a configurable logic controlling the plurality of memory cells; and
    a control block coupled to the memory array and the logic array, the control block to control a computational pipeline to perform computations on the data by activating at least one of: one or more bitlines of the plurality of bitlines or one or more wordlines of the plurality of wordlines,
    wherein the control block is further to:
    pre-charge a selected bitline of the plurality of bitlines; and evaluate, using the configurable logic implementing multi-level voltage evaluation, a row of memory cells addressed by a selected wordline.

2. The system of claim 1, wherein at least one wordline of the plurality of wordlines is open during a pre-charge operation of the selected bitline.

3. The system of claim 1, wherein the control block is further to:
store, in an available memory cell accessible via a wordline of the plurality of wordlines, a state of the selected bitline.

4. The system of claim 1, wherein the configurable logic comprises at least one of: a pull-up network (PUN) or a pull-down network (PDN).

5. The system of claim 1, wherein the configurable logic is controlled by one or more inputs received from the control block.

6. The system of claim 1, wherein the configurable logic is controlled by one or more inputs received from the memory array.

7. The system of claim 1, wherein the configurable logic is controlled by one or more inputs received from an external source.

8. The system of claim 1, wherein the computational pipeline comprises a systolic array.

9. The system of claim 1, wherein the sense amplifier array comprises a plurality of sense amplifiers, each sense amplifier configured to:
receive, from a selected bitline of the plurality of bitlines, a signal encoding content of a memory cell coupled to the selected bitline; and
amplify the sensed signal.

10. The system of claim 1, implemented as a system-on-chip, the system further comprising:
at least one processing core; and
at least one input/output (I/O) interfaces.

11. A system, comprising:
a memory array to store data in a plurality of memory cells electrically coupled to a plurality of wordlines and a plurality of bitlines, the memory array to implement configurable logic controlling the plurality of memory cells;
a sense amplifier array coupled to the memory array, the sense amplifier array comprises a plurality of sense amplifiers, each sense amplifier configured to receive, from a selected bitline of the plurality of bitlines, a signal encoding content of a memory cell coupled to the selected bitline; and
a control block coupled to the memory array, the control block to control a computational pipeline to perform computations on the data by activating at least one of: one or more bitlines of the plurality of bitlines or one or more wordlines of the plurality of wordlines, wherein the control block is further to:
pre-charge a selected bitline of the plurality of bitlines; and
evaluate, using the configurable logic implementing multi-level voltage evaluation, a row of memory cells addressed by a selected wordline.

12. The system of claim 11, wherein at least one wordline of the plurality of wordlines is open during the pre-charge operation of the selected bitline.

13. The system of claim 11, wherein the control block is further to:
store, in an available memory cell accessible via a wordline of the plurality of wordlines, a state of the selected bitline.

14. The system of claim 11, wherein the control block is further to:
pre-charge a second wordline using a voltage level specified by an input supplied by the control block.

15. The system of claim 11, wherein the configurable logic comprises at least one of: a pull-up network (PUN) or a pull-down network (PDN).

16. The system of claim 11, wherein the configurable logic is controlled by a plurality of inputs received from at least one of: the control block, the memory array, or an external source.

17. The system of claim 11, implemented as a system-on-chip, the system further comprising:
at least one processing core; and
at least one input/output (I/O) interfaces.

18. A method, comprising:
implementing a configurable logic by storing data in a memory array comprising a plurality of memory cells electrically coupled to a plurality of wordlines and a plurality of bitlines;
activating one or more bitlines of the plurality of bitlines;
pre-charging a selected bitline of the one or more bitlines; and
receiving, by a sense amplifier, from the selected bitline, a signal encoding content of a memory cell coupled to the selected bitline; and
evaluating, using the configurable logic implementing multi-level voltage evaluation, a row of memory cells addressed by a selected wordline.

19. The method of claim 18, further comprising:
storing, in an available memory cell accessible via a wordline of the plurality of wordlines, a state of the selected bitline.

20. The method of claim 18, wherein the first pull network is provided by one of: a pull-up network (PUN) or a pull-down network (PDN).

* * * * *